(12) United States Patent
Wada (10) Patent No.: US 6,807,110 B1
(45) Date of Patent: Oct. 19, 2004

(54) SEMICONDUCTOR MEMORY DEVICE

(75) Inventor: Osamu Wada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/447,231

(22) Filed: May 29, 2003

(30) Foreign Application Priority Data

Mar. 31, 2003 (JP) ........................................ 2003-095399

(51) Int. Cl.⁷ ............................................. G11C 16/04
(52) U.S. Cl. ................... 365/189.07; 365/210; 365/205
(58) Field of Search ............................ 365/189.07, 210, 365/205, 207

(56) References Cited

U.S. PATENT DOCUMENTS 5,303,197 A * 4/1994 Miyashita et al. .......... 365/210

FOREIGN PATENT DOCUMENTS

JP          2-226581        9/1990

* cited by examiner

*Primary Examiner*—David Lam
(74) *Attorney, Agent, or Firm*—Oblon, Spivak, McClelland, Maier & Neustadt, P.C.

(57) ABSTRACT

A semiconductor memory device includes a first bit line and a second bit line to which data read from first and second memory cells are supplied, respectively, when a word line is activated. A first dummy bit line is provided between the first and second bit lines without interposing any other bit line therebetween and fixed to the ground potential. A first and second sense amplifier amplify potentials on the first and second bit lines, respectively. A connection control section controls so that write data is supplied to the first bit line or second bit line after the word line is activated and before the first and second sense amplifiers operate.

25 Claims, 10 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2003-095399, filed Mar. 31, 2003, the entire contents of which are incorporated herein by reference.

BACKGROUND OF THE INVENTION

1. Field of the Invention

The present invention relates to a semiconductor memory device, particularly to a semiconductor memory device having a write operation function of transferring data to a bit line before a sense amplifier is activated.

2. Description of the Related Art

Figure 11:
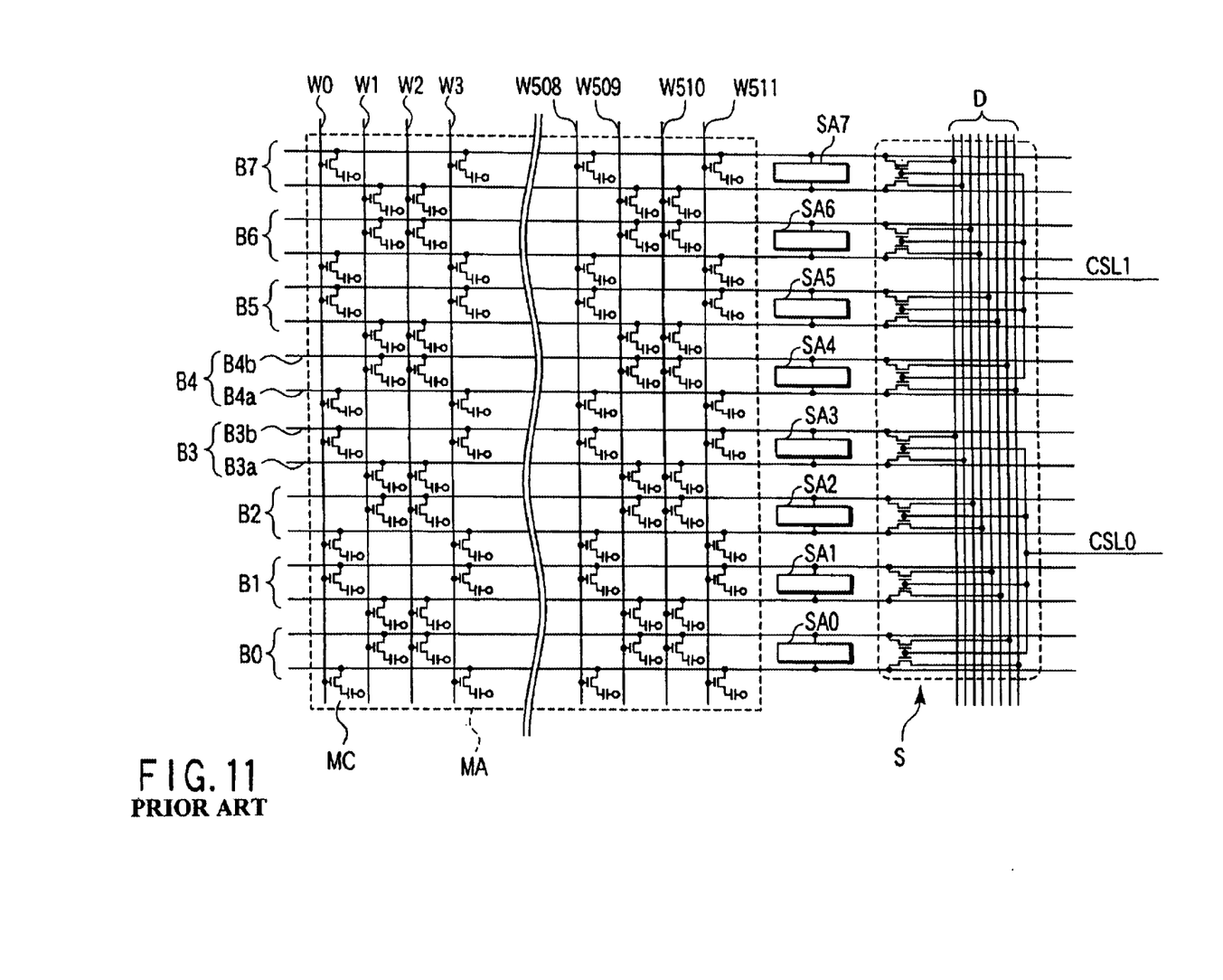
FIG. 11 is a circuit diagram schematically showing a part of a general DRAM.

FIG. 11 schematically shows a part of a general DRAM (Dynamic Random Access Memory). A write operation of the DRAM is briefly described below. First, when one word line (e.g. word line W0) is selected, data output from a memory cell MC connected to the word line is read to complementary bit line pairs B0 to B7. Then, potentials on the bit line pairs B0 to B7 are amplified by sense amplifiers SA0 to SA7. When a column selection signal CSL0 is supplied, write data is transferred to the bit line pairs B0 to B3 from a data line D. Because the bit line pairs B4 to B7 which are not selected perform normal read operations (hereafter, the refresh operation is executed), data is read to the bit line pairs B4 to B7 from the memory cell MC.

In the case of the data write, when data stored in the memory cell is different from data to be written in the memory cell, it is necessary to reverse potential relations between bit line pairs. Therefore, the write operation is delayed.

As one of measures for improving the delay, a write operation referred to as an early write operation is generally known. In the early write operation, data is transferred to a bit line pair before a sense amplifier is activated (before data from a memory cell is amplified) and the bit line pair is set to a potential corresponding to the data before a change of levels of the bit line pair starts to make a big change. Then, after the potential of the bit line pair is amplified, data is written in the memory cell. An example of the above technique is disclosed in Jpn. Pat. Appln. KOKAI Publication No. 2-226581.

Figure 12:
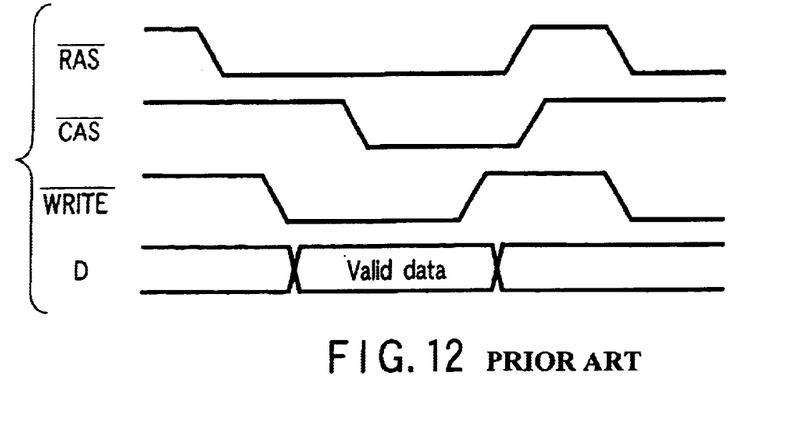
FIG. 12 is an illustration for explaining the early write operation.

The early write operation is also described as shown in FIG. 12. First, a row address signal is fetched when an inversion signal of RAS falls. Then, an inversion signal of WRITE for designating the write operation is made to fall before an inversion signal of CAS for fetching a column address signal falls. According to the above control, the write data is transferred to the bit line pair before the sense amplifier is activated.

In a circuit shown in FIG. 11, the following problem occurs by executing the early write operation. First, attention is given to the boundary between the bit line pairs B0 to B3 to be controlled by a column selection signal CSL0 and the bit line pairs B4 to B7 to be controlled by a column selection signal CSL1.

Figure 13A:
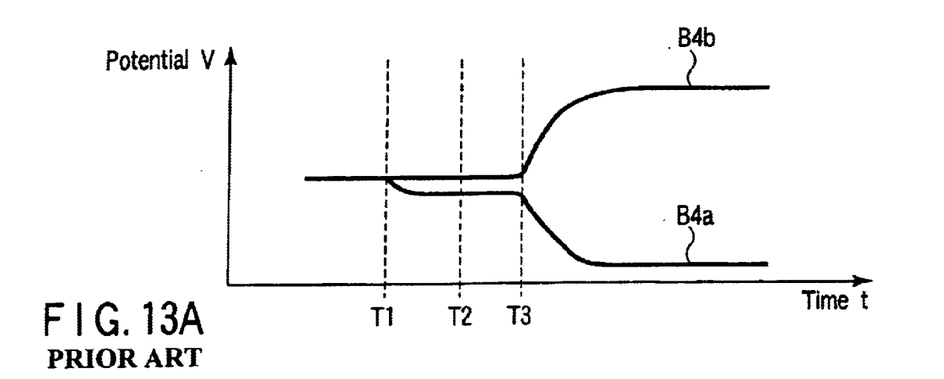
FIGS. 13A and 13B are illustrations showing changes of potentials of bit line pairs to which different column selection signals are supplied.
Figure 13B:
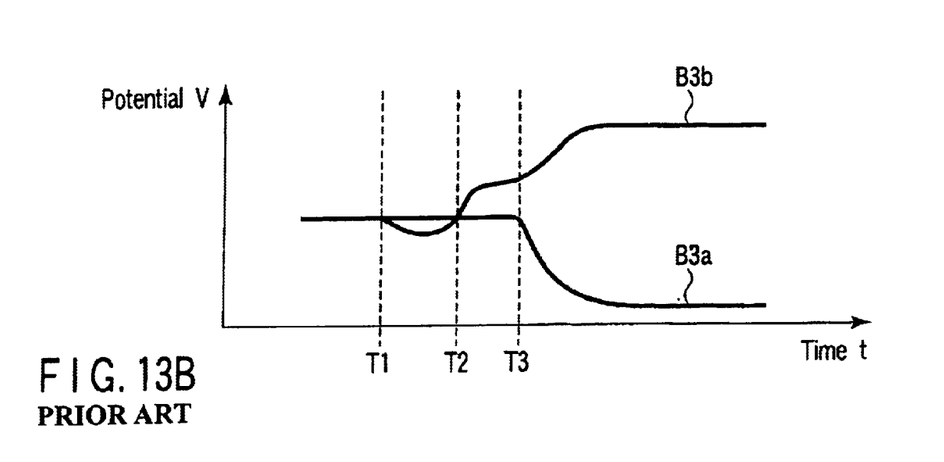

FIGS. 13A and 13B show a state of the bit line pair B4 (bit lines B4a and B4b) and a state of the complementary bit line pair B3 (bit lines B3a and B3b) in the case where the column selection signal CSL0 is supplied, respectively. In the case of write according to the early write operation, write of data in the bit line B3b starts (rise of the potential of the bit line B3b starts) before column selection at time T2 as shown in FIG. 13B. Before amplification starts (before time T3), the bit line B4a at a low potential is easily influenced by the bit line B3b. Particularly, when the potential relation between the bit lines B3b and B4a is reversed, the potential of the bit line B4a is greatly influenced and a malfunction of a DRAM may occur. This problem becomes more remarkable as the distance between bit lines decreases due to improvement of a DRAM in integration degree and decrease of the DRAM in size.

BRIEF SUMMARY OF THE INVENTION

According to a first aspect of the present invention, there is provided a semiconductor memory device comprising: first and second bit lines to which data read from first and second memory cells are supplied, respectively, when a word line is activated; a first dummy bit line provided between the first and second bit lines without interposing any other bit line therebetween and fixed to the ground potential; first and second sense amplifiers which amplify potentials on the first and second bit lines, respectively; and a connection control section which controls so that write data is supplied to the first bit line or the second bit line after the word line is activated and before the first and second sense amplifiers operate.

According to a second aspect of the present invention, there is provided a semiconductor memory device comprising: a word line constituting gates of first and second memory cell transistors serving as parts of first and second memory cells and extending in a first direction; a wiring layer extending in the first direction above the word line and electrically isolated from the word line; first and second bit lines to which data read from first and second memory cells are supplied, respectively, when the word line is activated; first and second sense amplifiers which amplify potentials on the first and second bit lines, respectively; a connection control section which controls so that write data is supplied to the first bit line or the second bit line after the word line is activated and before the first and second sense amplifier operate; and a connection layer provided only between the first and second bit lines to electrically connect the word line with the wiring layer.

According to a third aspect of the present invention, there is provided a semiconductor memory device comprising: first to n-th (n is a natural number of 2 or more) bit line groups which are sequentially arranged so as to be adjacent to each other and respectively comprise a plurality of bit lines adjacent to each other along a first direction, data read from a plurality of memory cells respectively connected with the plurality of bit lines being read to the bit lines; a plurality of first dummy bit lines provided between the bit lines forming a boundary between an i-th (i is a natural number of 1 to n−1) bit line group and an (i+1)-th bit line group without interposing any other bit line and fixed to the ground potential; a plurality of sense amplifiers provided for each of the plurality of the bit lines, respectively, and amplifying potentials on the plurality of bit lines; and a connection control section which controls so that write data is supplied to one of the first to n-th bit line groups after the word line is activated and before the sense amplifiers operate.

According to a fourth aspect of the present invention, there is provided a semiconductor memory device comprising: a word line constituting gates of memory cell transistors serving as parts of memory cells and extending in a first direction; a wiring layer extending in the first direction above the word line and electrically isolated from the word line; first to n-th (n is a natural number of 2 or more) bit line groups which are sequentially arranged so as to be adjacent to each other and respectively comprise a plurality of bit lines adjacent to each other along a second direction different from the first direction, data read from a plurality of memory cells respectively connected with the plurality of bit lines being read to the bit lines; a plurality of sense amplifiers provided for each of the plurality of the bit lines, respectively, and amplifying potentials on the plurality of bit lines; a connection control section which controls so that write data is supplied to one of the first to n-th bit line groups after the word line is activated and before the sense amplifiers operate; and a connection layer provided only between the bit lines which form a boundary between an i-th (i is a natural number of 1 to n−1) bit line group and an (i+1)-th bit line group to electrically connect the word line with the wiring layer.

DETAILED DESCRIPTION OF THE INVENTION

Figure 1:
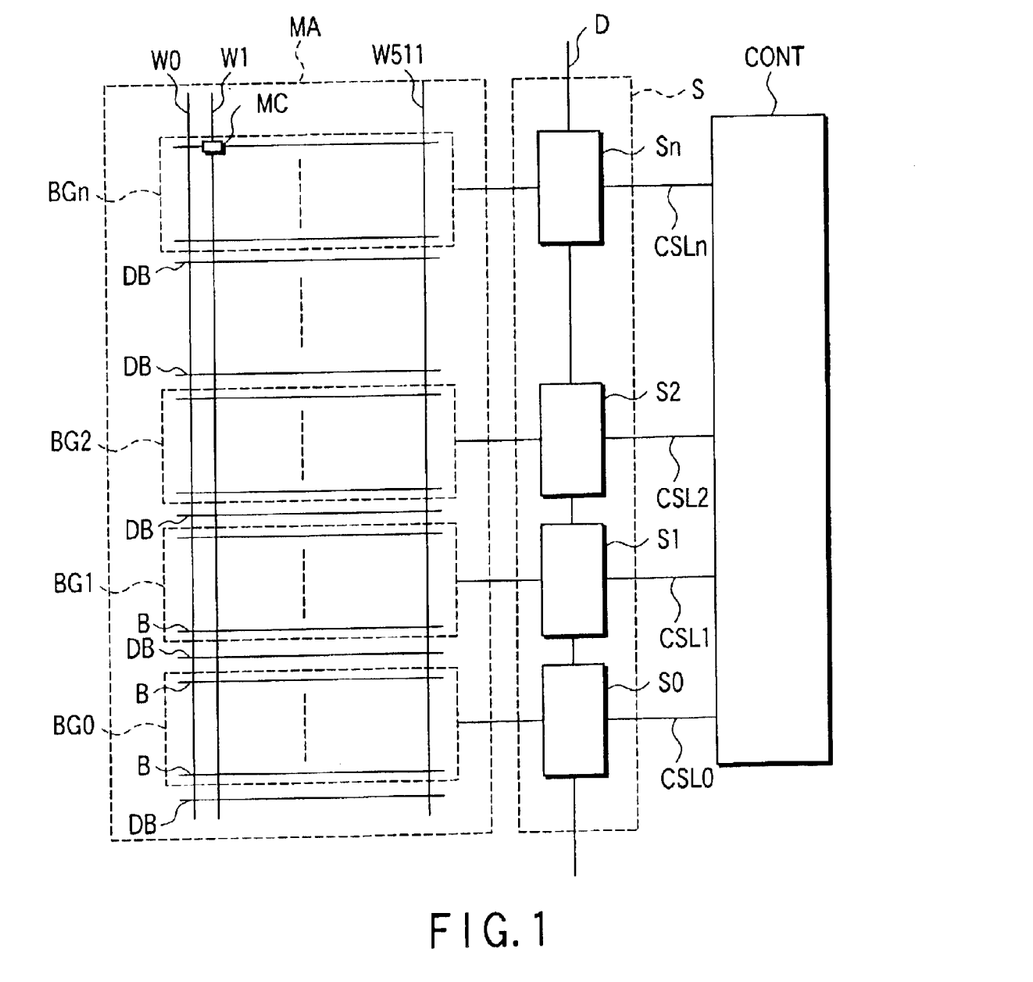
FIG. 1 is a block diagram schematically showing a part of a semiconductor memory device according to a first embodiment of the present invention.

Embodiments of the present invention will be described below by referring to the accompanying drawings. In the description below, components having almost the same function and configuration are provided with the same symbol and duplicate explanation is made only if necessary.
(First Embodiment)
FIG. 1 is a block diagram schematically showing a part of a semiconductor memory device according to a first embodiment of the present invention. As shown in FIG. 1, the semiconductor memory device has a memory cell array section MA, a column selection switch section (connection control section) S, and a control section CONT. Sense amplifiers (not shown) are provided between the column selection switch section S and the control section CONT.

The memory cell array section MA has bit line groups BG0 to BGn. The bit line group BG0 has a plurality of bit lines B arranged along the same direction. The bit line groups BG1 to BGn also have the same configuration. Word lines W0, W1, . . . , W511 are arranged so as to intersect with the bit line groups BG0 to BGn. The memory cell array section MA has a memory cells MC (only one is illustrated) connected with the bit lines B. Column selection switch sections S0 to Sn control a connection between the bit line groups BG0 to BGn and the data line D. The column selection switch sections S0 to Sn are controlled in accordance with column selection signals CSL0 to CSLn output from the control section CONT.

Dummy bit lines DB are set between adjacent two of the bit line groups BG0 to BGn. In other words, the dummy bit line DB is provided for every group of the bit lines B which are controlled by the same column selection signal.

Figure 2:
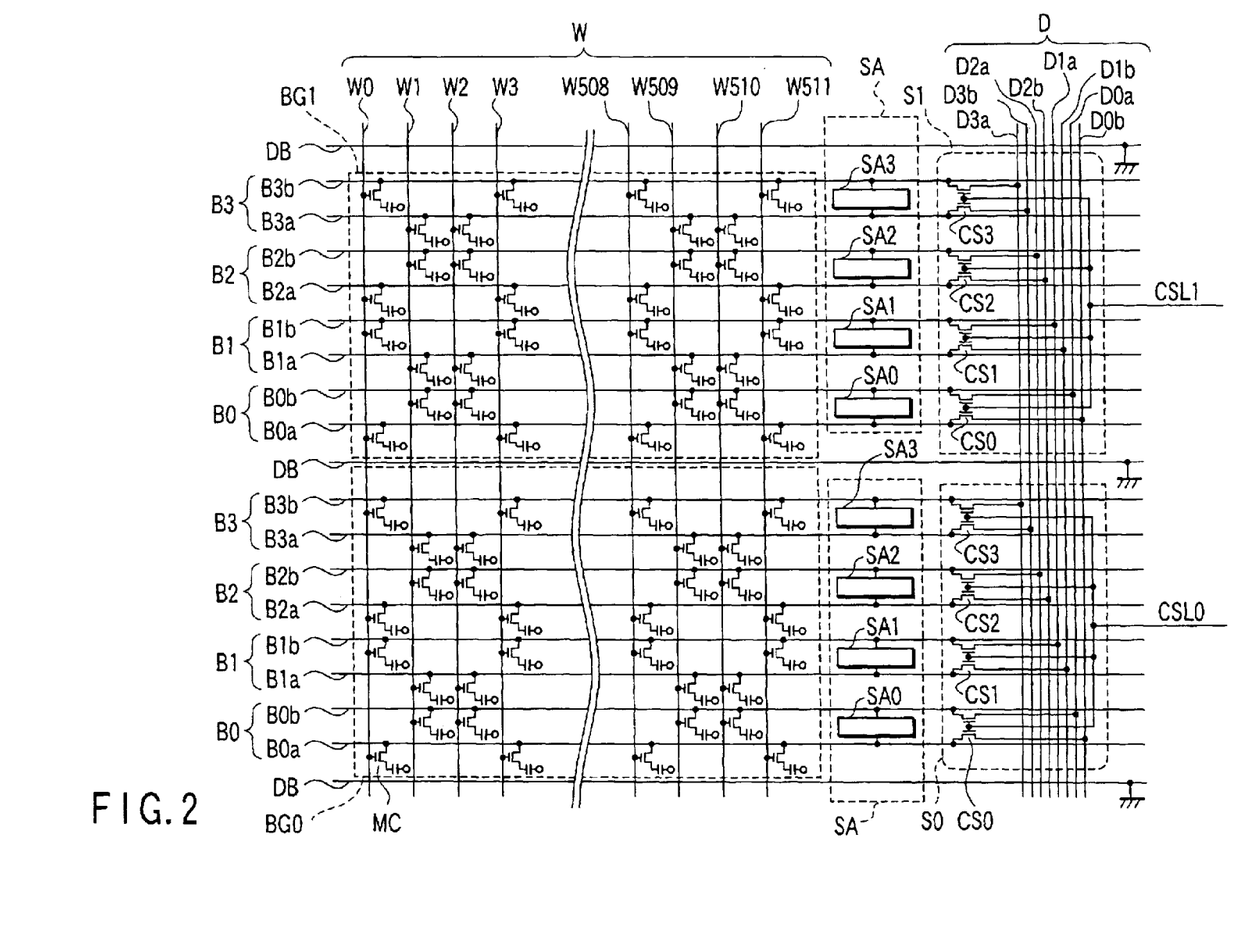
FIG. 2 is a circuit diagram schematically showing a part of the semiconductor memory device in FIG. 1.

Then, a detailed configuration of the semiconductor memory device in FIG. 1 is described below. FIG. 2 is a circuit diagram schematically showing a part of the semiconductor memory device in FIG. 1. FIG. 2 shows only the bit line groups BG0 and BG1 and parts relating to the groups.

As shown in FIG. 2, the bit line group BG0 has complementary bit line pairs B0 to B3. Bit lines B0a and B0b constitute the bit line pair B0. Bit lines B1a and B1b constitute the bit line pair B1. Bit lines B2a and B2b constitute the bit line pair B2. Bit lines B3a and B3b constitute the bit line pair B3. The bit lines B0a to B3b correspond to the bit lines B collectively shown in FIG. 1.

A memory cell MC having a well-known configuration is set at predetermined intersections formed by the word lines W0 to W511 and the bit lines B0a to B3b. The memory cell MC comprises a transistor and a capacitor provided between one end of a current path of the transistor and a ground end. A gate of the transistor constituting the memory cell is connected with the word lines W0 to W511.

The other ends of the current path of the transistor whose gates are connected with the word line W0 is connected with, for example, the bit lines B0a, B1b, B2a, and B3b. The other ends of the current path of the transistor whose gate are connected with the word line W1 are connected with, for example, the bit lines B0b, B1a, B2b, and B3a. The other ends of the current path of the transistor connected with word lines W3, . . . , W508, and W511 are connected the same as those connected with the word line W0. The other ends of the current path of the transistor connected with word lines W2, . . . , W509, and W510 are connected the same as those connected with the word line W1.

Sense amplifiers SA0 to SA3 are provided for every bit line pairs B0 to B3. The sense amplifiers SA0 to SA3 are provided between two bit lines constituting the bit line pairs B0 to B3 to amplify potentials on the bit lines B0a to B3b. Moreover, though configurations of the sense amplifiers SA0 to SA3 are not described in detail, they are realized by using two CMOS inverter circuits including a P-channel MOSFET (Metal Oxide Silicon Field Effect Transistor) and an N-channel MOSFET. Typically, a latching circuit obtained by alternately connecting inputs and outputs of these two inverter circuits is used. A column selection switch CS0 is set between the bit lines B0a and B0b. The column selection switch CS0 has functions of transferring data from the bit lines B0a and B0b to the data line D in accordance with the supply of the column selection signal CSL0 and transferring data sent from the data line D to the bit lines B0a and B0b. Specifically, the column selection switch CS0 has two transistors whose gates are connected each other and ends of current paths of these transistors are connected with the bit lines B0a and B0b, respectively. The other ends of the current paths of the transistors are connected with the data lines D3a and D3b, respectively and the column selection signal CSL0 is supplied to the gates of the transistors.

Column selection switches CS1, CS2, and CS3 are set between the bit lines B1a and B1b, between the bit lines B2a and B2b, and between the bit lines B3a and B3b, respectively, as well as the column selection switch CS1. The other ends of current paths of transistors of the column selection switch CS1 are connected with data lines D2a and D2b. The other ends of current paths of transistors of the column selection switch CS2 are connected with data lines D1a and D1b. The other ends of current paths of transistors of the column selection switch CS3 are connected with data lines D0a and D0b.

The bit line group BG1 and the memory cells MC belonging to the bit line group BG1 have the same configuration as the bit line group BG0 having the above configuration and the memory cells MC belonging to the group BG0. Moreover, the bit line groups BG2 to BGn in FIG. 1 and the memory cells MC belonging to the groups BG2 to BGn also have the configuration same as the bit line group BG0 and the memory cells MC belonging to the bit line group BG0.

Moreover, the sense amplifiers SA0 to SA3 of the above configuration are set and connected with the bit line group BG1. Furthermore, the sense amplifiers SA0 to SA3 are set similarly to the bit line groups BG2 to BGn in FIG. 1.

The column selection switch section S1 has the same configuration as the column selection switch section S0. However the section S1 is different from the section S0 in that the column selection signal CSL1 is supplied to the column selection switches CS0 to CS3. Moreover, the column selection switch sections S2 to Sn in FIG. 1 also have the same configuration as the column selection switch section S0 and the column selection signals CSL2 to CSLn are supplied to the column selection switch sections S2 to Sn, respectively.

The dummy bit line DB is set adjacently to the bit lines B at the both ends of each of the bit line groups BG0 to BGn (bit lines B constituting each of the boundary among the bit line groups BG0 to BGn) in parallel with the bit lines B. Specifically, they are set as described below. First, the dummy bit line DB is set adjacently to the bit line B0a which is at one end of the bit line group BG0. Moreover, the dummy bit line DB is set between the bit line B3b of the bit line group BG0 and the bit line B0a of the bit line group BG1. Furthermore, the dummy bit line DB is set adjacently to the bit line B3b of the bit line group BG2.

Each of the dummy bit lines DB shown in FIGS. 1 and 2 is set without interposing any bit line B between the dummy bit line DB and adjacent bit line B, and fixed to the ground potential. No memory cell MC is connected to the dummy bit lines DB.

The dummy bit lines DB have the same configuration as bit lines B shown in FIG. 1 (specifically, bit lines B0a to B3b in FIG. 2). That is, the dummy bit lines DB and the bit lines B are formed in the same process and some lines originally used as bit lines are diverted as dummy bit lines. Therefore, the distance between one dummy bit line DB and the adjacent bit line B is the same as that between two bit lines B. Moreover, the dummy bit lines DB are set to a layer at the same height as the bit lines B. Further, the dummy bit lines DB are constituted by a material substantially the same as the bit lines B. Furthermore, the dummy bit lines DB have sectional areas same as, for example, the bit lines B.

According to the semiconductor device of the first embodiment of the invention, the dummy bit line DB is set between bit lines B which are adjacent to each other and controlled in accordance with different column selection signals without interposing another bit line B between the two bit lines B. Moreover, dummy bit lines DB are set between adjacent two of the bit line groups BG0 to BGn which are controlled in accordance with different column selection signals.

The distance between one dummy bit line DB and the bit line B adjacent to it is the same as the distance between two bit lines B. Therefore, the distance between two bit lines B to be controlled in accordance with different column selection signals increases. In other words, the distances between adjacent two of the bit line groups BG0 to BGn which are controlled in accordance with different column selection signals increase. Accordingly, even if write data is supplied to either of two bit lines B which are controlled in accordance with different column selection signals through the early write operation, it is possible to greatly reduce the probability that the data in the other bit line B under read operation is influenced.

Moreover, the dummy bit lines DB have the same configuration as the bit lines B. That is, the dummy bit lines DB are uniformly formed in a step of forming the bit lines B and any one of wiring structures to be originally used as bit lines B is used as the dummy bit line DB. Therefore, it is possible to easily realize the above configuration with the conventional fabrication process and method. In this case, the distance between the bit lines B to be controlled in accordance with different column selection signals, in other words distances between adjacent two of the bit line groups BG0 to BGn which are controlled in accordance with different column selection signals, is two times larger than the case in which no dummy bit line DB is set.

By merely increasing intervals between adjacent two of the bit line groups BG0 to BGn, the above advantage can be obtained. In this case, however, distances between each two bit lines B are uneven. The structure works as a negative factor in a fabrication process. According to the first embodiment, however, it is possible to effectively use steps used at present, avoiding the negative effect.

Moreover, the dummy bit lines DB fixed to the ground potential are set between every adjacent two of the bit line groups BG0 to BGn. Therefore, it is possible to greatly reduce the probability that potentials of the bit lines B (bit lines B3b and B0a) at the both ends of each of the bit line groups BG0 to BGn fluctuate compared to the case of simply increasing distances between adjacent two of the bit line groups BG0 to BGn.

Providing the dummy bit lines DB actually increases the area of the memory cell array section MA. Conventionally, a problem occurring between two bit lines to be controlled in accordance with different column selection signals is not so grave. In other words, the bit lines normally operate. However, this problem cannot be ignored as a semiconductor memory device is further miniaturized and the same trend is estimated in future. Therefore, even if the area of the memory array section MA slightly increases, it is effective to apply this embodiment in order to prevent a semiconductor memory device from malfunctioning.

Figure 3:
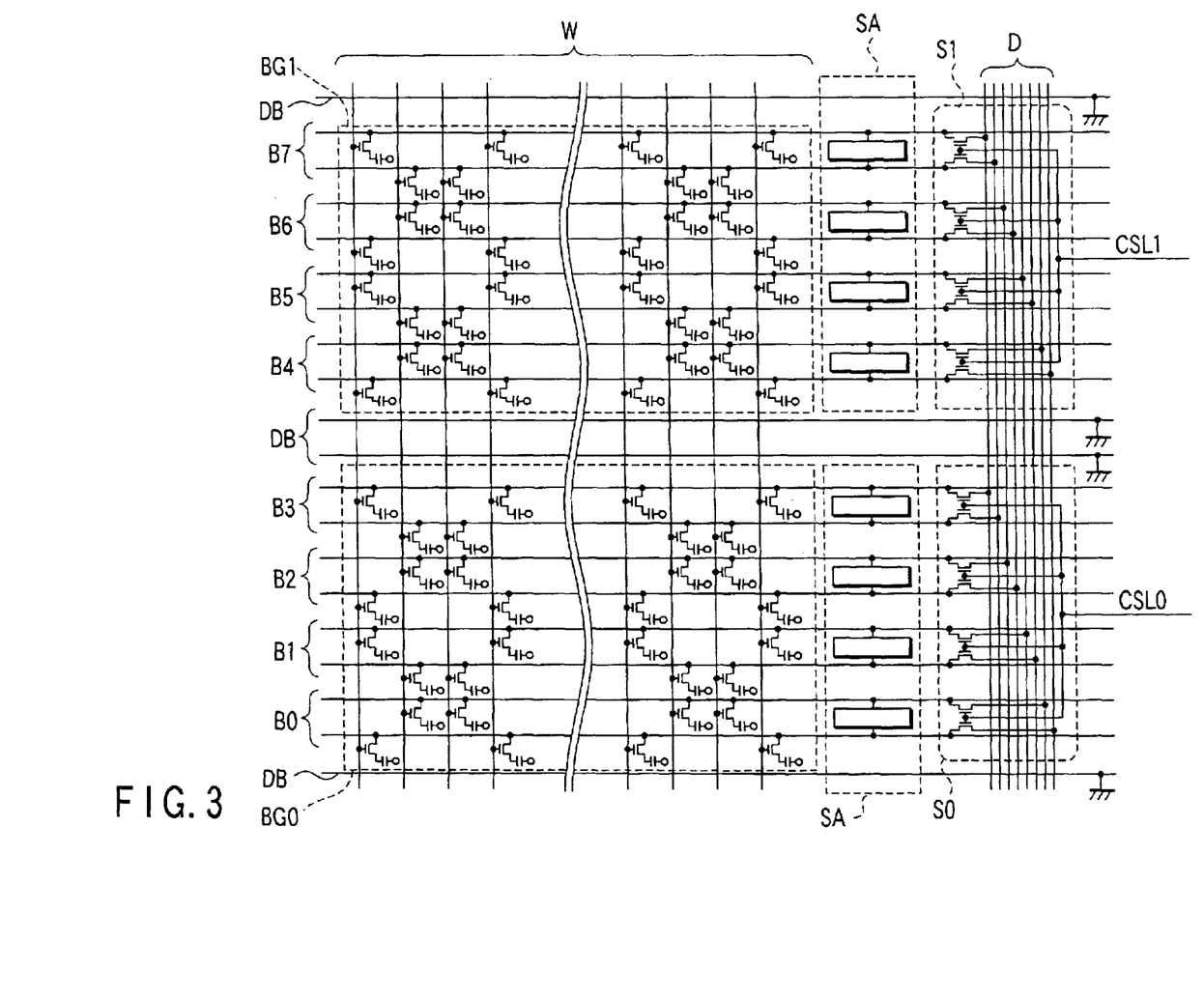
FIG. 3 is a circuit diagram schematically showing a part of a semiconductor memory device according to a modification of the first embodiment of the invention.

Although one dummy bit line DB is set between adjacent two of the bit line groups BG0 to BGn in FIG. 2, it is also possible to set two or more dummy bit lines. FIG. 3 shows a case of setting two dummy bit lines. By increasing distances between adjacent two of the bit line groups BG0 to BGn, it is possible to reduce noise occurring between bit lines forming the boundaries. However, when increasing the distances, the area of the memory cell array section MA increases. Therefore, it is important to decide a distance at which a semiconductor memory device does not malfunction due to noise and set the number of bit lines in accordance with the distance. This description is also applied to the following second and third embodiments.

Moreover, one bit line group is constituted by four bit line pairs. However, it is also possible to constitute a bit line group having the number of bit line pairs other than four. The same is also applied to the second and third embodiments.

(Second Embodiment)

Figure 4:
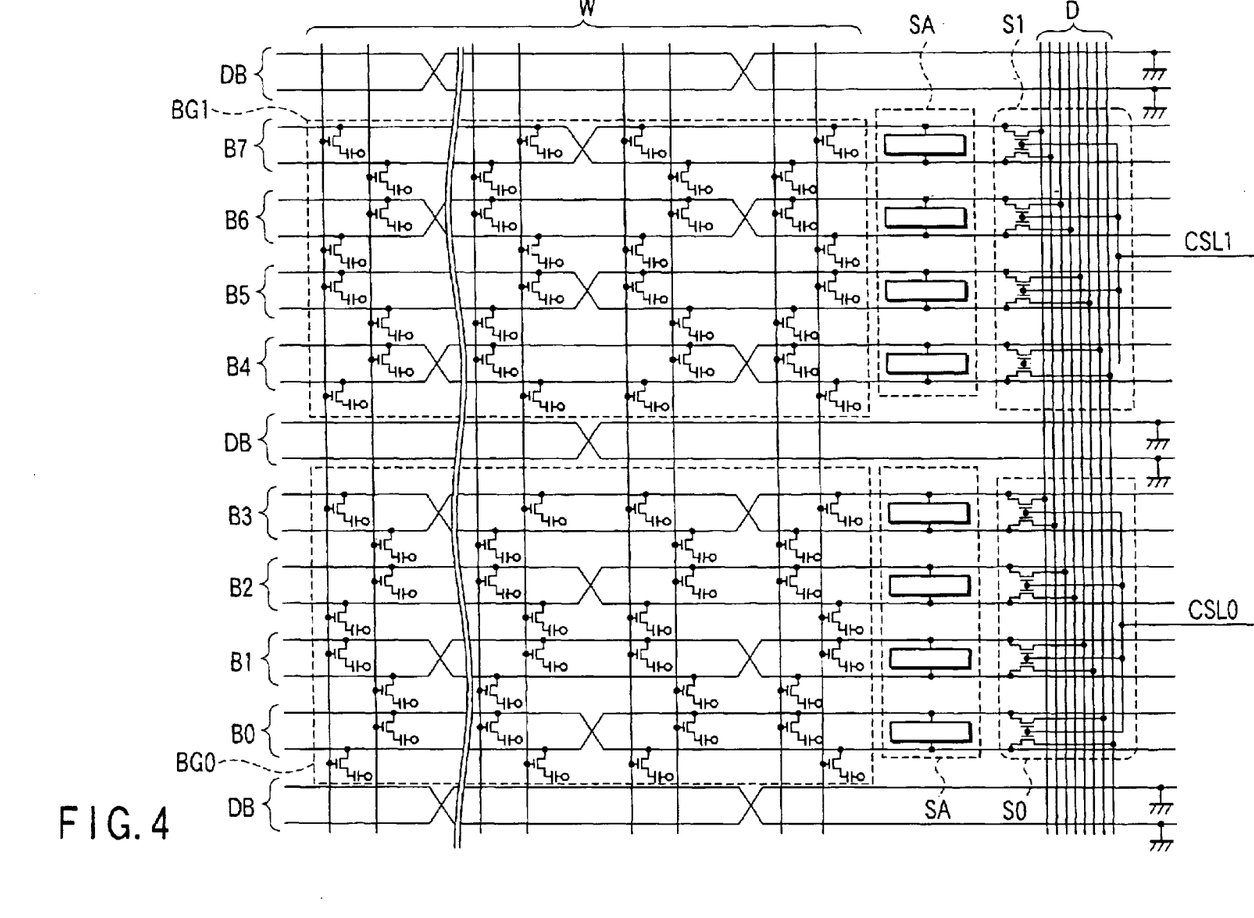
FIG. 4 is a circuit diagram schematically showing a part of a semiconductor memory device according to a second embodiment of the present invention.

A second embodiment of the invention uses a so-called twisted structure in which lines constituting a bit line pair intersect with each other for a bit line B and a dummy bit line DB. FIG. 4 is a circuit diagram schematically showing a part of a semiconductor memory device according to the second embodiment of the invention. The entire configuration is the same as that in FIG. 1. FIG. 4 shows only bit line groups BG0 and BG1 and parts relating to the groups BG0 and BG1. A configuration of bit line groups BG2 to BGn is also the same as that of the bit line groups BG0 and BG1 to be described below.

As shown in FIG. 4, bit line pairs B0 to B3 respectively have a twisted structure. Moreover, two dummy bit lines DB are set between adjacent two of the bit line groups BG0 to BGn and have the twisted structure.

Now, the twisted structure will be described below. A bit line pair having the twisted structure is set on a first line L1 and a second line L2 along the first line L1 on the same plane. Each one of the two bit lines constituting the bit line pair are sequentially replaced with each other on the first line L1 and second line L2. That is, two bit lines constituting the bit line pair are arranged so as to be vertically distributed on a certain plane and the vertical relation between these bit lines are sequentially replaced.

Figure 5:
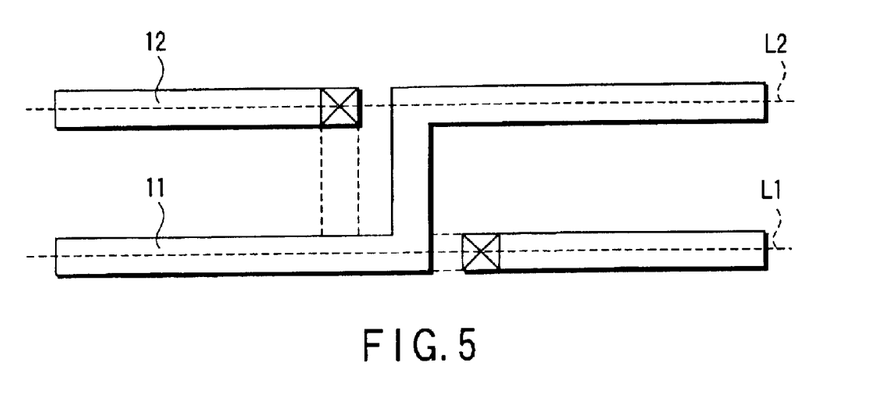
FIG. 5 is a plan view schematically showing a part of a twisted structure of a bit line pair.
Figure 6:
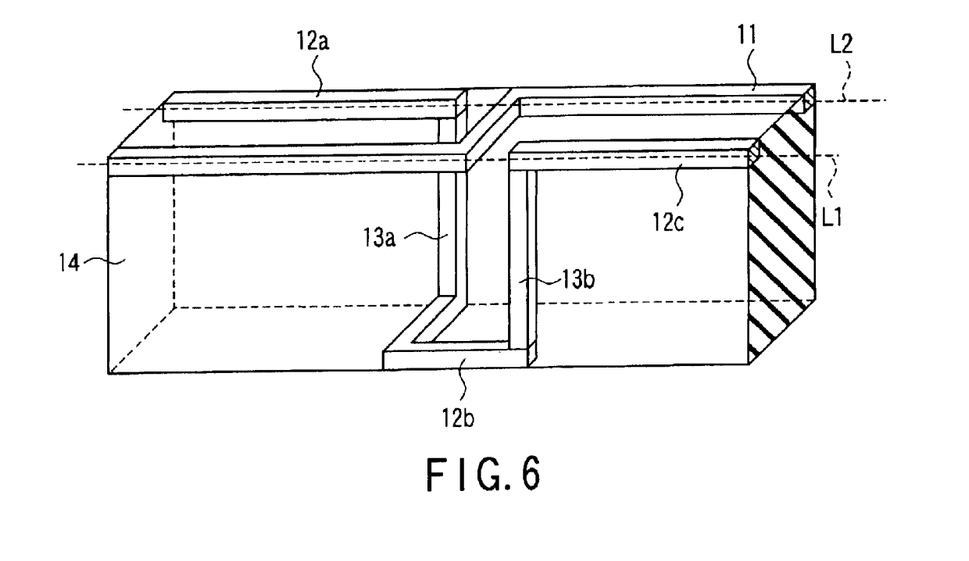
FIG. 6 is a perspective view of FIG. 5.

The twisted structure typically has the following structure. FIG. 5 is a plan view schematically showing a part of the twisted structure of a bit line pair. FIG. 6 is a perspective view of the part. FIGS. 5 and 6 respectively show only a part at which bit lines intersect with each other.

A bit line 12 moves from the position on the second line L2 to the position on the first line L1 by passing under the bit line 11. More specifically, the bit line 12 is constituted as described below. First, the bit line 12 is formed by three parts 12a, 12b, and 12c and contacts 13a and 13b for connecting the three parts. The first part 12a on the second line L2 is connected to the second part 12b formed on a lower layer through the contact 13a. The second part 12b moves to the position located under the first line L1 after a bend. At this position, the second part 12b is connected with the third part 12c on the first line L1 through the contact 13b. Reference numeral 14 denotes an interlayer insulating film.

The structure shown in FIGS. 5 and 6 is sequentially repeated and thereby, the vertical relation between two bit lines on a plane is sequentially reversed.

By making each of the bit line pairs BG0 to BGn have a twisted structure, it is possible to cancel coupling noise occurring between bit lines B. The outline of the above mentioned is described below. When noticing a certain bit line B, the bit line B is replaced with the other bit line of a bit line pair in position. Moreover, the bit line adjacent to the former bit line is replaced with one bit line constituting another bit line pair in position. Thus, a bit line is successively replaced with the adjacent one in all bit lines. As a result, when noticing all bit lines, coupling noise occurring between bit lines B is entirely canceled.

The structure shown in FIGS. 5 and 6 is an example. It is sufficient that a structure is formed so that positions of the bit lines 11 and 12 are replaced with each other. For example, an intersecting bit line (bit line 12 in FIGS. 5 and 6) may go through an upper layer.

According to the semiconductor device of the second embodiment of the invention, dummy bit line pairs DB having the same configuration as the case of the first embodiment are set between adjacent two of the bit line groups BG0 to BGn. Therefore, the advantage as the first embodiment can be obtained.

Moreover, the bit line pairs B0 to B3 respectively have the twisted structure. Therefore, it is possible to reduce coupling noise among bit lines B.

Furthermore, the bit line pairs B0 to B3 and dummy bit line pairs DB have the twisted structure. In other words, bit line structures respectively having the twisted structure are formed and some of the bit line structures eventually serve as the dummy bit line pairs DB. Therefore, to form the dummy bit line pairs DB, it is not necessary to newly prepare a mask pattern for forming bit line structures or change a fabrication process. Therefore, it is possible to effectively use a conventional fabrication process.

Note that it is possible to form either the bit line pairs B0 to B3 or the dummy bit line pairs DB into a twisted structure. However, because of the same reason as the description for the first embodiment, it is possible to simplify a fabrication process by applying the twisted structure to both the bit line pairs B0 to B3 and the dummy bit line pairs DB. Therefore, it is effective to apply the twisted structure to both the bit line pairs B0 to B3 and the dummy bit line pairs DB.

(Third Embodiment)

In a third embodiment of the invention, taps for connecting a gate electrode of a memory cell transistor with a wiring layer formed in parallel with the gate electrode at an upper layer are concentrically set between adjacent two of the bit line groups BG0 and BGn.

Figure 7:
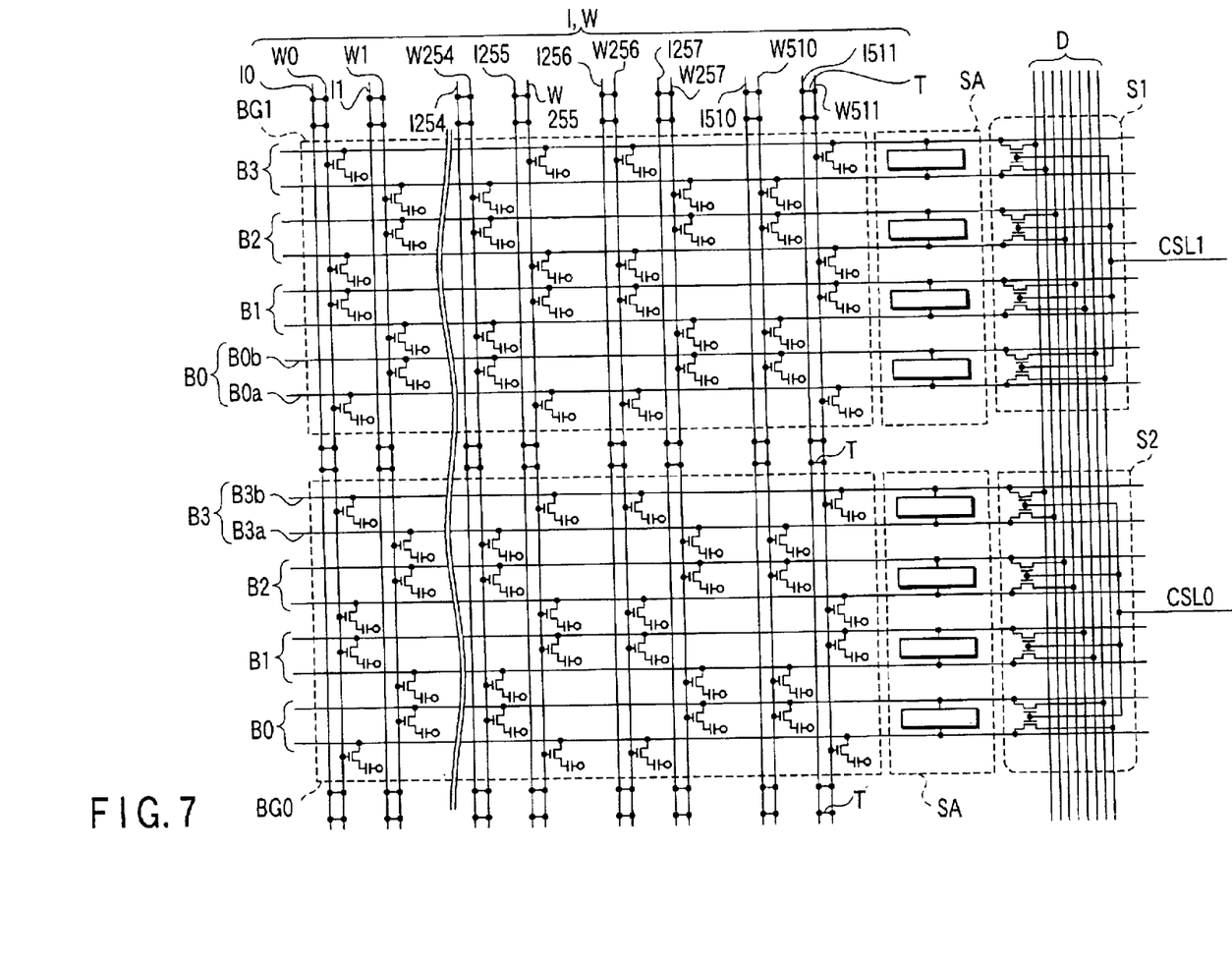
FIG. 7 is a circuit diagram schematically showing a part of a semiconductor memory device according to a third embodiment of the present invention.

FIG. 7 is a circuit diagram schematically showing a part of a semiconductor memory device according to the third embodiment of the invention. The entire configuration is the same as that in FIG. 1. FIG. 7 shows only bit line groups BG0 and BG1 and sections relating to the groups BG0 and BG1. Bit line groups BG2 to BGn have the same configuration as that of the bit line groups BG0 and BG1 described below.

As shown in FIG. 7, a semiconductor memory device has word lines (gate electrodes of memory cell transistor) W0 to W511 and wiring layers I0 to I511 formed on an upper layer in parallel with the word lines. The wiring layers I0 to I511 are formed for the word lines W0 to W511, respectively. Taps T connect the word lines W0 to W511 with the wiring layers I0 to I511, respectively. Taps T are concentrically set only between adjacent two of the bit line groups BG0 to BG1. The distance between bit lines B3b and B0a forming the boundary between the bit line groups BG0 and BG1 is larger than the distance between other bit lines B. That is, the distance between the bit line groups BG0 and BG1 is larger than the distance between the bit lines B. Therefore, each of distances between adjacent two of the bit line groups BG0 to BGn is larger than the distances between each two bit lines B.

In FIG. 7, sets of two taps T are set between the bit line groups BG1 and BG0. However, other than two taps T may form one set. It is important that taps T are set only between adjacent two of the bit line groups BG0 to BGn.

Figure 8:
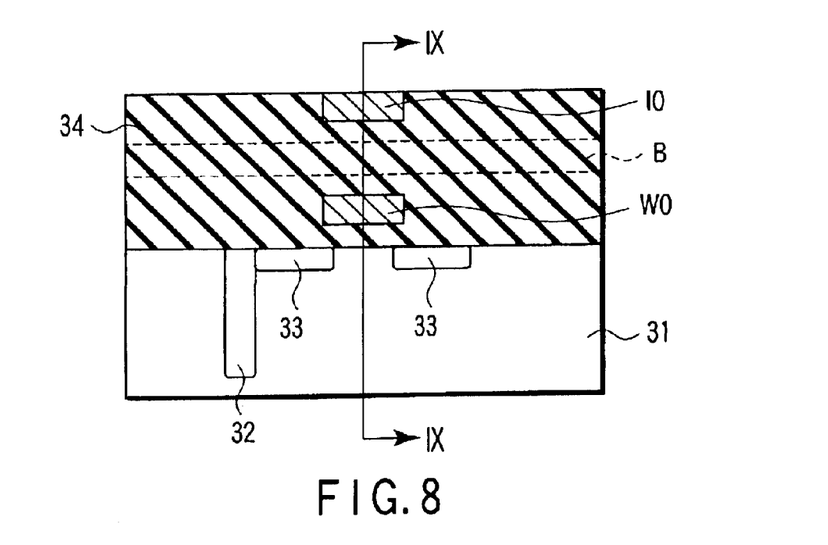
FIG. 8 is a sectional view schematically showing a part of FIG. 7.
Figure 9:
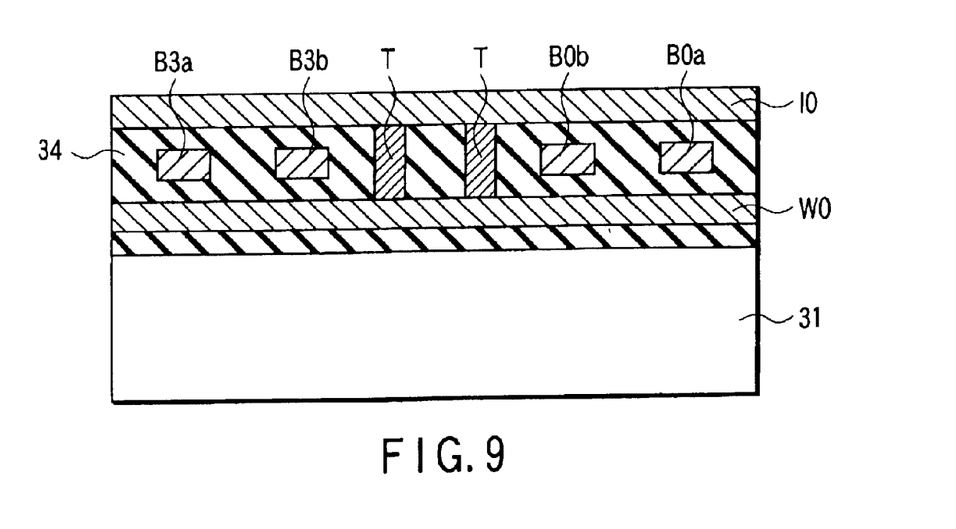
FIG. 9 is a sectional view schematically showing a part of FIG. 7.

Then, the tap T is described by using vicinities of the word line W0, wiring layer I0, and bit lines B3a, B3b, B0a, and B0b in FIG. 7 as examples and referring to FIGS. 8 and 9. The structure other than the portion shown in FIGS. 8 and 9 is the same as the structure described below.

FIGS. 8 and 9 are sectional views schematically showing the structure of the semiconductor memory device in FIG. 7. FIG. 9 shows the structure along the line IX—IX in FIG. 8. As shown in FIGS. 8 and 9, a capacitor 32 and source/drain diffusion regions 33 are formed in a surface of a semiconductor substrate 31. One of the source/drain diffusion regions 33 is connected with the capacitor 32. The word line W0 is formed on the semiconductor substrate 31 between the source/drain diffusion regions 33 with a gate insulating film (not shown) interposed therebetween. The bit lines B3a, B3b, B0a, B0b, and wiring layer I0 are formed in a interlayer insulating film 34 formed so as to cover the entire surface of the semiconductor substrate 31. The wiring layer I0 and word line W0 are connected each other by the taps T. The taps T penetrate the interlayer insulating film 34. A contact (not shown) connects the wiring layer I0 with a higher wiring layer (not shown).

The word line W0 is typically formed by polysilicon. On the other hand, the wiring layer I0 is formed by a material having a sheet resistance value smaller than that of the word line W0 such as a metal. Polysilicon has a resistance value higher than that of a metal frequently used for the wiring layer I0. Therefore, it is possible to reduce the resistance value of the current path up to the gate electrode by forming the wiring layer I0 separately from the word line W0 and connecting the layer I0 with the line W0 by the taps T.

According to the semiconductor memory device of the third embodiment of the invention, taps T for electrically connecting the word lines W0 to W511 with the wiring layers I0 to I511 insulated from the word lines W0 to W511 are set only between adjacent two of the bit line groups BG0 to BGn. As a result, the distance between the bit lines B to be controlled in accordance with different column selection signals increases. In other words, each of distances between adjacent two of the bit line groups BG0 to BGn to be controlled in accordance with different column selection signals increase. Therefore, even when write data is supplied to one of two bit lines B to be controlled in accordance with different column selection signals through the early write operation, it is possible to greatly decrease the probability that the data in the other of the bit lines under the read operation is influenced.

Figure 10:
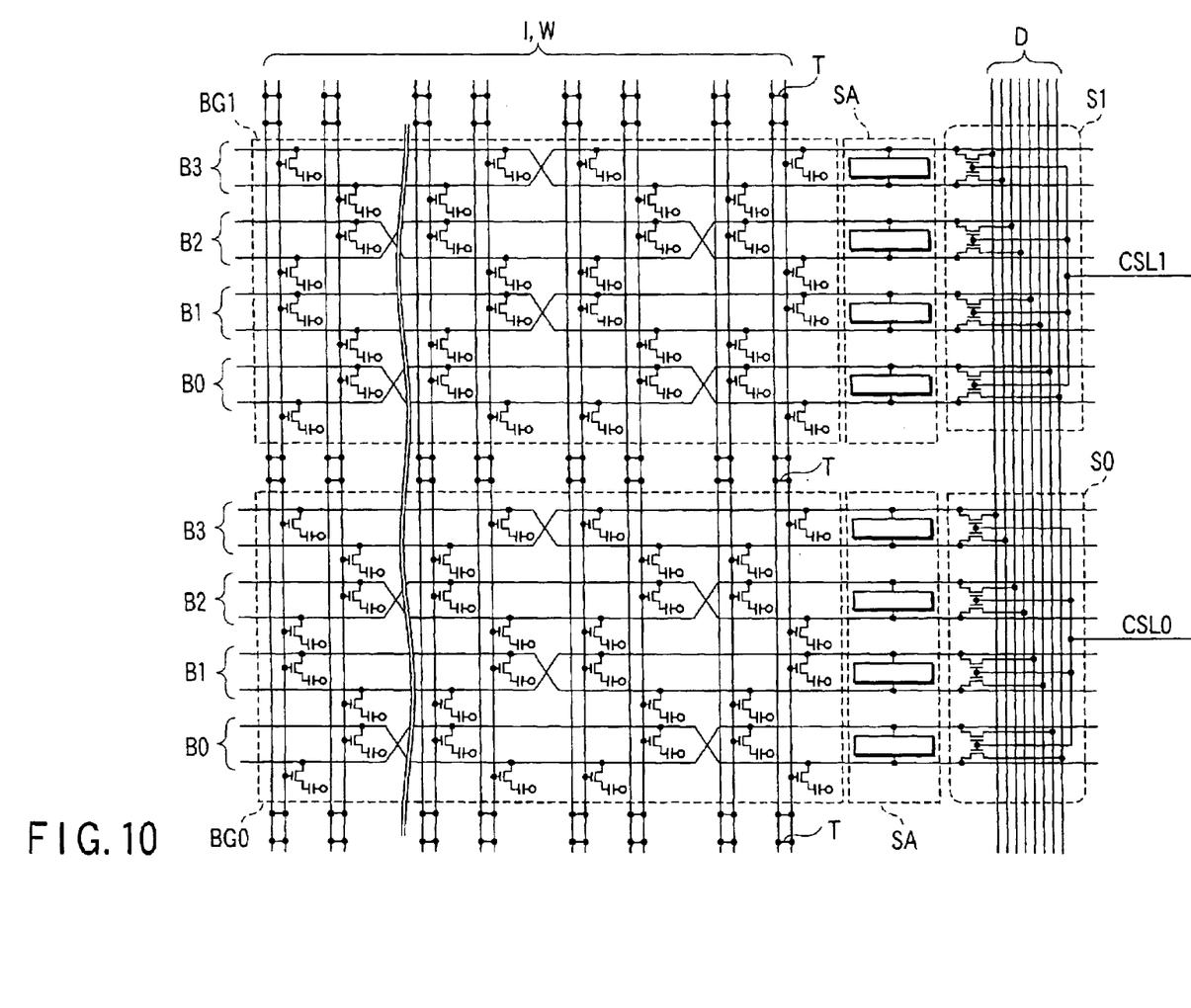
FIG. 10 is a circuit diagram schematically showing a part of a semiconductor memory device according to a modification of the third embodiment of the invention.

As shown in FIG. 10, it is also possible to apply a twisted structure to bit line pairs of the semiconductor memory device of the third embodiment. Thereby, the advantage of reducing coupling noise among the bit lines B as described for the second embodiment is obtained in addition to the advantage obtained from the third embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

first and second bit lines to which data read from first and second memory cells are supplied, respectively, when a word line is activated;

a first dummy bit line provided between the first and second bit lines without interposing any other bit line therebetween and fixed to the ground potential;

first and second sense amplifiers which amplify potentials on the first and second bit lines, respectively; and a connection control section which controls so that write data is supplied to the first bit line or the second bit line after the word line is activated and before the first and second sense amplifiers operate.

2. The device according to claim 1, wherein the connection control section comprises;

a first switching section which controls a connection between a data line to which the write data is supplied and the first bit line in accordance with supply of a first control signal, and a second switching section which controls a connection between the data line and the second bit line in accordance with supply of a second control signal, one of the first and second control signals being supplied at a time.

3. The device according to claim 2, comprising a plurality of bit lines uniformly formed at equal intervals, wherein the first and second bit lines and the first dummy bit line are included in said plurality of bit lines, and said plurality of bit lines have a first bit line group and a second bit line group, the first control signal controls a connection between the first bit line group and the data line, the second control signal controls a connection between the second bit line group and the data line, and the first bit line belongs to the first bit line group and the second bit line belongs to the second bit line group.

4. The device according to claim 1, wherein the first and second bit lines and the first dummy bit line are arranged at substantially the same height.

5. The device according to claim 1, wherein the first dummy bit line is substantially constituted by a material same as that of the first and second bit lines.

6. The device according to claim 1, comprising a plurality of bit lines uniformly formed at equal intervals, wherein the first and second bit lines and the first dummy bit line are included in said plurality of bit lines.

7. The device according to claim 1, wherein the first bit line and a third bit line arranged along the first bit line constitute a first bit line pair, the second bit line and a fourth bit line arranged along the second bit line constitute a second bit line pair, the first dummy bit line and a second dummy bit line arranged along the first dummy bit line constitute a dummy bit line pair, and the second dummy bit line is arranged between the first dummy bit line and the first bit line and fixed to the ground potential.

8. The device according to claim 7, wherein the first bit line pair is arranged on first and second lines separate from each other, and the first and third bit lines are sequentially replaced with each other on the first and second lines, the second bit line pair is arranged on third and fourth lines separate from each other, and the second and fourth bit lines are sequentially replaced with each other on the third and fourth lines and, the dummy bit line pair is arranged on fifth and sixth lines separate from each other, and the first and second dummy bit lines are sequentially replaced with each other on the fifth and sixth lines.

9. A semiconductor memory device comprising:

a word line constituting gates of first and second memory cell transistors serving as parts of first and second memory cells and extending in a first direction;

a wiring layer extending in the first direction above the word line and electrically isolated from the word line;

first and second bit lines to which data read from first and second memory cells are supplied, respectively, when the word line is activated;

first and second sense amplifiers which amplify potentials on the first and second bit lines, respectively;

a connection control section which controls so that write data is supplied to the first bit line or the second bit line after the word line is activated and before the first and second sense amplifier operate; and a connection layer provided only between the first and second bit lines to electrically connect the word line with the wiring layer.

10. The device according to claim 9, wherein the connection control section comprises;

a first switching section which controls a connection between a data line to which the write data is supplied and the first bit line in accordance with supply of a first control signal, and a second switching section which controls a connection between the data line and the second bit line in accordance with supply of a second control signal, one of the first and second control signals being supplied at a time.

11. The device according to claim 10, comprising a plurality of bit lines uniformly formed, wherein the first and second bit lines are included in said plurality of bit lines, said plurality of bit lines have a first bit line group and a second bit line group, the first control signal controls a connection between the first bit line group and the data line, the second control signal controls a connection between the second bit line group and the data line, and the first bit line belongs to the first bit line group and the second bit line belongs to the second bit line group.

12. The device according to claim 9, wherein the wiring layer has a sheet resistance value lower than that of the word line.

13. The device according to claim 9, wherein the first bit line and a third bit line arranged along the first bit line constitute a first bit line pair, the second bit line and a fourth bit line arranged along the second bit line constitute a second bit line pair, the first dummy bit line and a second dummy bit line arranged along the first dummy bit line constitute a dummy bit line pair, and the second dummy bit line is arranged between the first dummy bit line and the first bit line and fixed to the ground potential.

14. The device according to claim 13, wherein the first bit line pair is arranged on first and second lines separate from each other, and the first and third bit lines are sequentially replaced with each other on the first and second lines and, the second bit line pair is arranged on third and fourth lines separate from each other, and the second and fourth bit lines are sequentially replaced with each other on the third and fourth lines.

15. A semiconductor memory device comprising:

first to n-th (n is a natural number of 2 or more) bit line groups which are sequentially arranged so as to be adjacent to each other and respectively comprise a plurality of bit lines adjacent to each other along a first direction, data read from a plurality of memory cells respectively connected with the plurality of bit lines being read to the bit lines;

a plurality of first dummy bit lines provided between the bit lines forming a boundary between an i-th (i is a natural number of 1 to n−1) bit line group and an (i+1)-th bit line group without interposing any other bit line and fixed to the ground potential;

a plurality of sense amplifiers provided for each of said plurality of the bit lines, respectively, and amplifying potentials on said plurality of bit lines; and a connection control section which controls so that write data is supplied to one of the first to n-th bit line groups after the word line is activated and before the sense amplifiers operate.

16. The device according to claim 15, wherein the connection control section comprises first to n-th switching sections which respectively control connections between a data line to which the write data is supplied and the first to n-th bit line groups in accordance with supply of first to n-th control signals, one of the first to n-th control signals are supplied at a time, and the data line is connected with one of the first to n-th switching sections at a time.

17. The device according to claim 15, wherein the bit lines of the first to i-th bit groups and the first dummy bit line are arranged at substantially the same height.

18. The device according to claim 15, wherein the first dummy bit line is substantially constituted by a material same as that of the bit lines of the first to i-th bit line groups.

19. The device according to claim 15, wherein adjacent two bit lines constitute a bit line pair, the first dummy bit line and a second dummy bit line provided along the first dummy bit line constitute a dummy bit line pair, and the second dummy bit line is arranged between the first dummy bit line and one of the bit lines forming the boundary and fixed to the ground potential.

20. The device according to claim 19, wherein the bit line pair is arranged on first and second lines separate from each other, and two bit lines constituting the bit line pair are sequentially replaced with each other on the first and the second lines, and the dummy bit line pair is arranged on third and fourth line separate from each other, and the first and second dummy bit lines are sequentially replaced with each other on the third and fourth lines.

21. A semiconductor memory device comprising:

a word line constituting gates of memory cell transistors serving as parts of memory cells and extending in a first direction;

a wiring layer extending in the first direction above the word line and electrically isolated from the word line;

first to n-th (n is a natural number of 2 or more) bit line groups which are sequentially arranged so as to be adjacent to each other and respectively comprise a plurality of bit lines adjacent to each other along a second direction different from the first direction, data read from a plurality of memory cells respectively connected with the plurality of bit lines being read to the bit lines;

a plurality of sense amplifiers provided for each of said plurality of the bit lines, respectively, and amplifying potentials on said plurality of bit lines;

a connection control section which controls so that write data is supplied to one of the first to n-th bit line groups after the word line is activated and before the sense amplifiers operate; and a connection layer provided only between the bit lines which form a boundary between an i-th (i is a natural number of 1 to n−1) bit line group and an (i+1)-th bit line group to electrically connect the word line with the wiring layer.

22. The device according to claim 21, wherein the connection control section comprises first to n-th switching sections which respectively control connections between a data line to which the write data is supplied and the first to n-th bit line groups in accordance with supply of first to n-th control signals, one of the first to n-th control signals are supplied at a time, and the data line is connected with one of the first to n-th switching sections at a time.

23. The device according to claim 21, wherein the wiring layer has a sheet resistance value lower than that of the word line.

24. The device according to claim 21, wherein adjacent two bit lines constitute a bit line pair, the first dummy bit line and a second dummy bit line provided along the first dummy bit line constitute a dummy bit line pair, and the second dummy bit line is arranged between the first dummy bit line and one of the bit lines forming the boundary and fixed to the ground potential.

25. The device according to claim 24, wherein the bit line pair is arranged on first and second lines separate from each other, and two bit lines constituting the bit line pair are sequentially replaced each other on the first and second lines.

* * * * *